United States Patent
Rhodes et al.

(10) Patent No.: US 7,420,233 B2
(45) Date of Patent: Sep. 2, 2008

(54) PHOTODIODE FOR IMPROVED TRANSFER GATE LEAKAGE

(75) Inventors: Howard E. Rhodes, Boise, ID (US); Richard A. Mauritzson, Boise, ID (US); Inna Patrick, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 91 days.

(21) Appl. No.: 10/689,712

(22) Filed: Oct. 22, 2003

(65) Prior Publication Data

US 2005/0087782 A1    Apr. 28, 2005

(51) Int. Cl.
*H01L 31/068* (2006.01)
(52) U.S. Cl. ............ 257/292; 257/E31.06; 257/E27.133
(58) Field of Classification Search ......... 257/290–293, 257/214, 215, E27.133
See application file for complete search history.

(56) References Cited

U.S. PATENT DOCUMENTS

| | | | |
|---|---|---|---|
| 6,127,697 A | | 10/2000 | Guidash |
| 6,221,686 B1 | | 4/2001 | Drowley et al. |
| 6,228,674 B1 | * | 5/2001 | Pan ............................ 438/63 |
| 6,291,280 B1 | | 9/2001 | Rhodes |
| 6,291,289 B2 | | 9/2001 | Rhodes et al. |
| 6,307,243 B1 | | 10/2001 | Rhodes |
| 6,326,652 B1 | | 12/2001 | Rhodes |
| 6,407,417 B1 | * | 6/2002 | Nagata et al. ............... 257/292 |
| 6,489,643 B1 | * | 12/2002 | Lee et al. ..................... 257/292 |
| 6,521,925 B1 | * | 2/2003 | Mori et al. .................. 257/292 |
| 6,566,678 B1 | * | 5/2003 | Maeda et al. ................. 257/22 |
| 6,570,201 B2 | * | 5/2003 | Shim .......................... 257/292 |
| 6,661,459 B1 | * | 12/2003 | Koizumi et al. ............. 348/310 |
| 6,690,423 B1 | * | 2/2004 | Nakamura et al. .......... 348/311 |
| 6,706,550 B2 | * | 3/2004 | Lee et al. ...................... 438/57 |
| 6,809,309 B2 | * | 10/2004 | Kwon ....................... 250/214.1 |
| 2001/0006237 A1 | * | 7/2001 | Abe .......................... 257/215 |
| 2002/0011614 A1 | | 1/2002 | Rhodes |
| 2002/0084835 A1 | | 7/2002 | Takahashi |
| 2002/0089004 A1 | | 7/2002 | Rhodes |
| 2003/0030083 A1 | * | 2/2003 | Lee et al. ..................... 257/292 |
| 2004/0046193 A1 | * | 3/2004 | Park et al. ................... 257/292 |
| 2004/0108502 A1 | * | 6/2004 | Nakamura et al. ............ 257/61 |
| 2005/0064613 A1 | * | 3/2005 | Takeuchi et al. .............. 438/24 |
| 2005/0087829 A1 | * | 4/2005 | Merrill et al. ................ 257/440 |

OTHER PUBLICATIONS

Merriam-Webster's Collegiate Dictionary, 10th Edition, Meriam Webster, Inc., 1997, pp. 14.*

* cited by examiner

*Primary Examiner*—Jerome Jackson, Jr.
(74) *Attorney, Agent, or Firm*—Dickstein Shapiro LLP

(57) ABSTRACT

An image sensing circuit and method is disclosed, wherein a photodiode is formed in a substrate through a series of angled implants. The photodiode is formed by a first, second and third implant, wherein at least one of the implants are angled so as to allow the resulting photodiode to extend out beneath an adjoining gate. Under an alternate embodiment, a fourth implant is added, under an increased implant angle, in the region of the second implant. The resulting photodiode structure substantially reduces or eliminates transfer gate sub-threshold leakage.

62 Claims, 9 Drawing Sheets

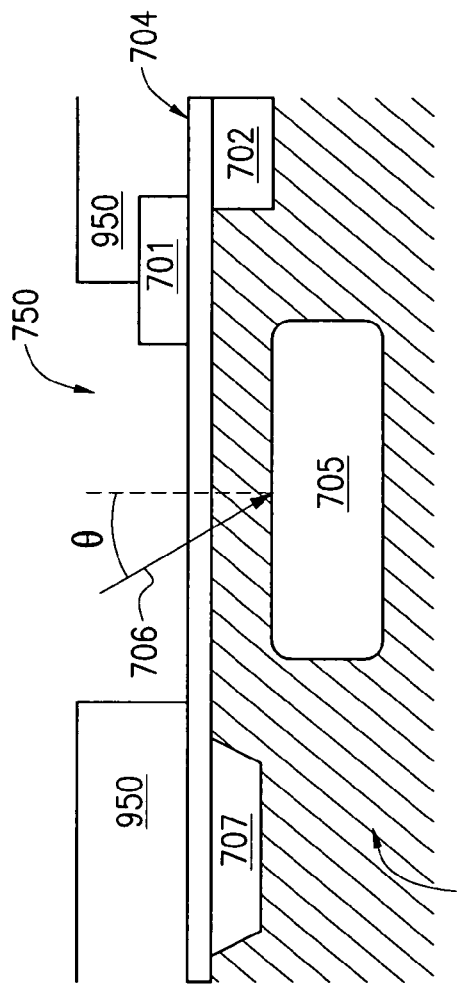
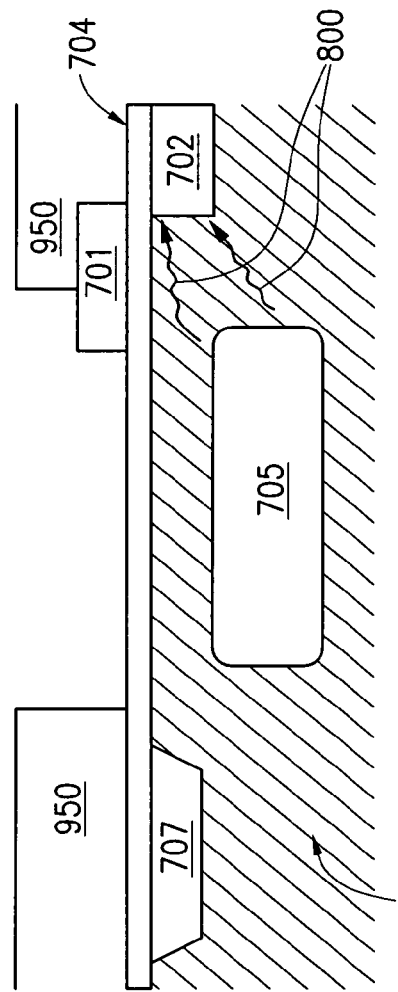

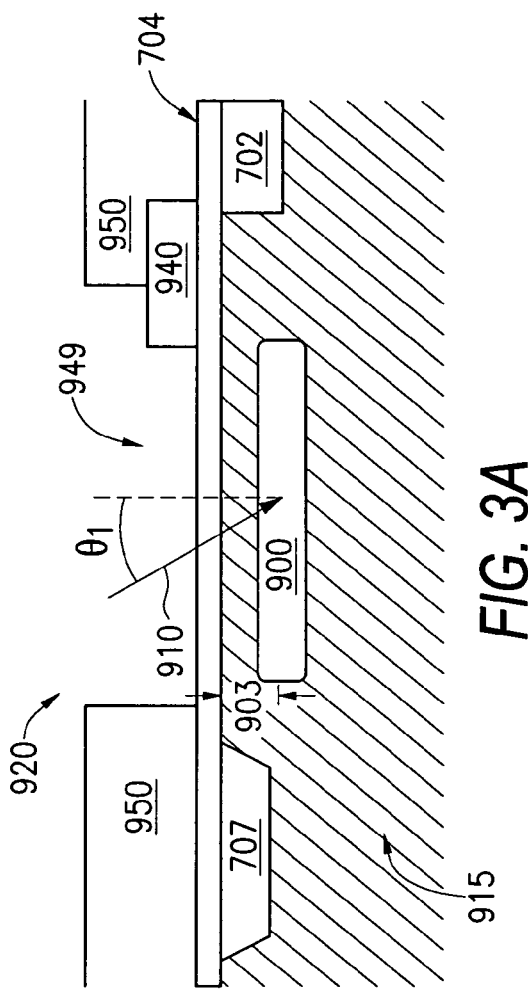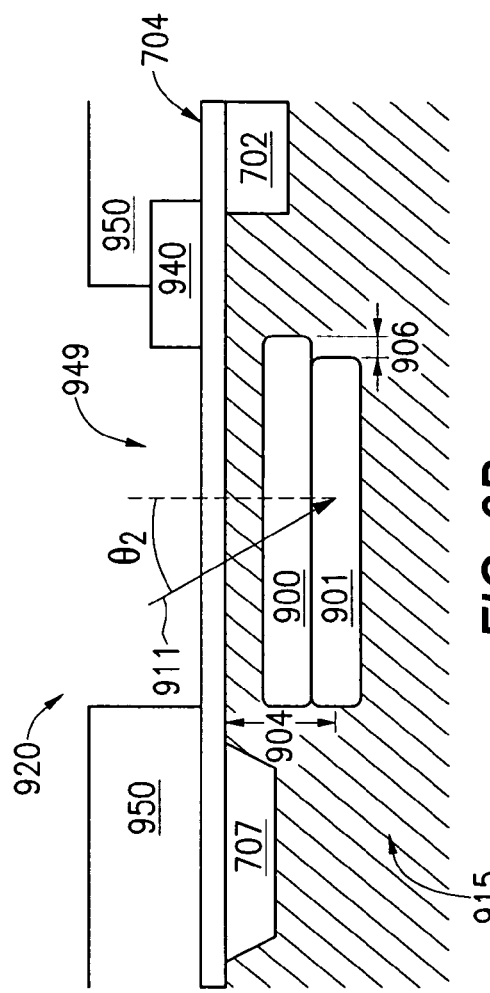

PHOTODIODE FOR IMPROVED TRANSFER GATE LEAKAGE

FIELD OF THE INVENTION

The present invention relates to improved photodiodes used in pixels of an image array.

BACKGROUND OF THE INVENTION

CMOS image devices having pixel sensor arrays are well known in the art and have been widely used due to their low voltage operation and low power consumption. CMOS image devices further have advantages of being compatible with integrated on-chip electronics, allowing random access to the image data, and having lower fabrication costs as compared to other imaging technologies. CMOS image devices are generally disclosed for example, in Nixon et al., "256×256 CMOS Active Pixel Sensor Camera-on-a-Chip," IEEE Journal of Solid State Circuits, vol. 31(12) pp. 2046-2050, 1996; Mendis et al., CMOS Active Pixel Image Sensors," IEEE Transactions on Electron Devices, vol. 41(3) pp. 452-453, 1994 as well as U.S. Pat. Nos. 5,708,263, 5,471,515, and 6,291,280, which are hereby incorporated by reference.

However, conventional CMOS image devices have some significant drawbacks. When photodiode implants are formed within a semiconductor substrate of a pixel cell adjacent a transfer transistor to transfer charge from the photodiode, the resulting structure creates leakage problems beneath the transfer gate, particularly during charge integration, when the transfer transistor is off. FIG. 1 illustrates a prior art pixel cell 750 with a n-type photodiode implant 705 set in a p-type substrate 915, wherein the implant is on one side of transfer gate 701, with a floating diffusion region 702 on the opposite side of gate 701. STI region 707 is an isolation region which isolates one pixel from another. The n-type photodiode implant 705 forms a P—N diode junction above implant 705 with the p-type material which is over implant 705.

The photodiode implant 705 is typically formed using an implant angle θ(706) in order to extend the implant slightly under gate 701 to provide sufficient conductivity between the photodiode n-region 705 and the channel region beneath transfer gate 701. Once implanted, the resulting extended photodiode n-region 705 facilitates transfer of electrons to the channel beneath gate 701 and to the floating diffusion 702 when the gate 701 is on (e.g., a positive voltage applied which is greater than the threshold of the transfer transistor formed by gate 701 and implant regions 702, 705). However, as is shown in FIG. 2, when transfer gate 701 is off, residual charge from n-region 705 leaks in the direction of arrows 800 beneath transfer gate 701 to floating diffusion region 702. This is due to the fact that the shallow angled implant results in a shape for n-region 705, where a portion of the photodiode is in very close proximity to the transfer gate 701. This proximity, while providing a good charge transfer when gate 701 is on, has the unwanted by-product of some undesirable charge leakage when the gate 701 is off. Accordingly, a better photodiode implant which provides good charge transfer when gate 701 is on, while lowering leakage when gate 701 is off is needed.

BRIEF SUMMARY OF THE INVENTION

The present invention provides a CMOS imager having a pixel array in which each pixel has an improved photodiode implant. The photodiode implant is created by tailoring the angle of a plurality of charge collection region implants so that the resulting charge collection region is positioned to provide a good charge transfer characteristic when the transfer transistor gate is on and lowered leakage across the channel region when the transistor gate is off. The photodiode charge collection region is formed through the successive implants into the substrate, some of which are angled, to minimize the barrier and in turn minimize the leakage.

The above and other advantages and features of the invention will be more clearly understood from the following detailed description which is provided in connection with the accompanying drawings.

BRIEF DESCRIPTION OF THE DRAWINGS

FIG. 1 shows a partially cut away side view of a prior art angled diode implant in a semiconductor imager;

FIG. 2 illustrates the leakage occurring beneath transfer gate 701 in the FIG. 1 arrangement;

FIG. 3A shows a first reduced-angle diode implant in accordance with a first embodiment of the invention;

FIG. 3B shows a second reduced-angle diode implant in accordance with the first embodiment of the invention;

DETAILED DESCRIPTION OF THE INVENTION

Figure 3C:
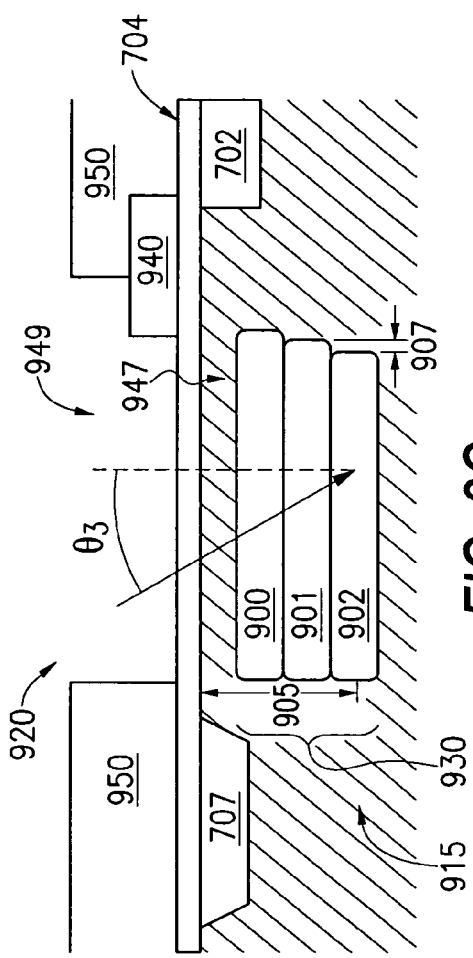
FIG. 3C shows a third reduced-angle diode implant in accordance with the first embodiment of the invention.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI) or silicon-on-sapphire (SOS) technology, doped and undoped semiconductors, epitaxial layers of silicon supported by a base semiconductor foundation, and other semiconductor structures. In addition, the semiconductor need not be silicon-based, but could be based on silicon-germanium, germanium, or gallium arsenide. Furthermore, when reference is made to a "wafer" or "substrate" in the following description, previous process steps may have been utilized to form regions or junctions in the base semiconductor structure or foundation.

The term "pixel" refers to a picture element unit cell containing a photosensor and transistors for converting electromagnetic radiation to an electrical signal. For purposes of illustration, a representative pixel is illustrated in the figures and description herein, and typically fabrication of all pixels in an imager will proceed simultaneously in a similar fashion. The following detailed description is, therefore, not to be taken in a limiting sense, and the scope of the present invention is defined by the appended claims.

Fabrication of a photodiode adjacent a transfer gate in accordance with a first embodiment of the invention will now be described. Referring to FIG. 3A, a portion of a substrate having a p-type doping region 915 is illustrated, where a photodiode will be produced. It is understood that the CMOS imager of the present invention can also be fabricated using n-doped regions in an p-well. A transfer gate stack 940 is fabricated over the substrate region 915. Any LDD source/drain implant associated with region 702 and with other transistors being fabricated on the same structure are performed and a photolithography resist 950 is then applied, having an opening 949 through which a doping implant for a photodiode can pass. The gate stack 940 contains a gate oxide and a conductor, where an insulator is placed over the conductor. The conductor may be formed from material such as polysilicon, silicide, metal, or a combination. The insulator may be formed from material such as oxide, nitride, metal oxide, or a combination.

FIG. 3A illustrates a first n-type diode implant (PD1) 900, formed in p-type substrate 915 through resist opening 949 at a depth indicated as 903, wherein the depth 903 is in the range of 0.1 to 0.7 microns, preferably 0.1-0.5. The dopants for the implant 900 are implanted at an angle θ1, shown as arrow 910, towards the transfer gate 940. Angle $\theta_1$ is measured away from a line normal to the surface of the sensor, as shown in FIG. 3A. Angle $\theta_1$ for implant 900 is set in the range of 0-30° normal to the surface of sensor 920, preferably at 0-15°. Implant 900 is preferably a low energy implant, where the implant energy used for implant 900 is in the range of 5-200 KeV, preferably less than 100 KeV. The implant dose for implant 900 is in the range of $2E11$-$1E13/cm^2$, preferably $1E12$-$6E12/cm^2$.

FIG. 3B illustrates a second n-type diode implant (PD2) 901, placed in p-type substrate 915 at a depth illustrated as 904, wherein implant 901 may be set forward from implant 900 in the direction of transfer gate 940, by a distance 906 as shown in FIG. 3B. The dopants for the implant 901 are set at an angle $\theta_2$ towards the transfer gate. Angle $\theta_2$ is measured away from a line normal to the surface of the sensor, as shown in FIG. 3B. Angle $\theta_2$ for implant 901 is preferably set in the range of 0-30° normal to the surface of sensor 920, preferably at 0-15°. Implant 901 is preferably a higher energy implant than that used for implant 900, where the implant energy for implant 901 is in the range of 30-300 KeV, preferably 50-250 KeV. The implant dose for implant 901 is in the range of $2E11$-$1E13/cm^2$, preferably $1E12$-$6E12/cm^2$.

FIG. 3C illustrates a third n-type diode implant (PD3) 902, placed in p-type substrate 915 at a minimum depth indicated as 905, wherein implant 902 may be offset from implant 901 by a distance 907 as shown in FIG. 3B. The dopants for the diode are implanted 912 at an angle $\theta_3$ towards the transfer gate. Angle $\theta_3$ is measured away from a line normal to the surface of the sensor, as shown in FIG. 3B. Angle $\theta_3$ for implant 902 is preferably set in the range of 0-30° normal to the surface of sensor 920. Implant 902 is preferably a high energy deep implant, where the implant energy for implant 902 is in the range of 60-500 KeV, preferably 100-400 KeV. The implant dose for implant 902 is in the range of $2E11$-$1E13/cm^2$, preferably $1E12$-$6E12/cm^2$. Once formed, the implants (900, 901, 902) of FIG. 3A-C collectively form an n-type electron collection 930 forming part of a photodiode with a p-type region 947, residing over region 930. Under the illustrations of FIGS. 3A-C, at least one of the implants must be angled.

Figure 3D:
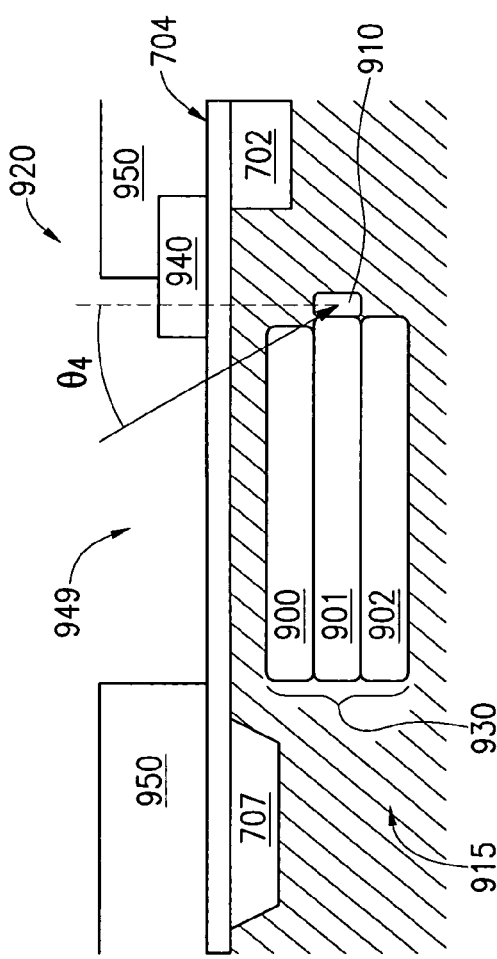
FIG. 3D shows a supplemental implant to the reduced-angle diode implant in accordance with a second embodiment of the invention.

FIG. 3D illustrates an alternate embodiment of the present invention, wherein three implants 900, 901 and 902 are implanted into a p-type substrate 915. The implants 900, 901 and 902, are placed in substrate 915 in a manner similar to that described in the embodiment of FIG. 3A-C, except that the implant angle for each of the implants ($\theta_1, \theta_2$, and $\theta_3$) is reduced to a range of 0-5°, where at least one of the implants 901 and 902 has an implant angle greater than 020 . Once the implants have been set, a fourth light implant (PD 4) 910 is made in the region of the second 901 implant, on the side closest to the transfer gate. The fourth implant is inserted 913 at an increased angle $\theta_4$, wherein the implant angle $\theta_4$ is measured away from a line normal to the surface of the substrate, as shown in FIG. 3D, and is preferably in the range of 10-30° of normal. Exemplary implant doses for the fourth implant may be in the range of $2e11/cm^2$-$5e12/cm^2$. It is understood that the order of the implants (900, 901, 902 and 904 (if provided)) is not critical; each of the disclosed implants may be arranged in any order.

Figure 4:
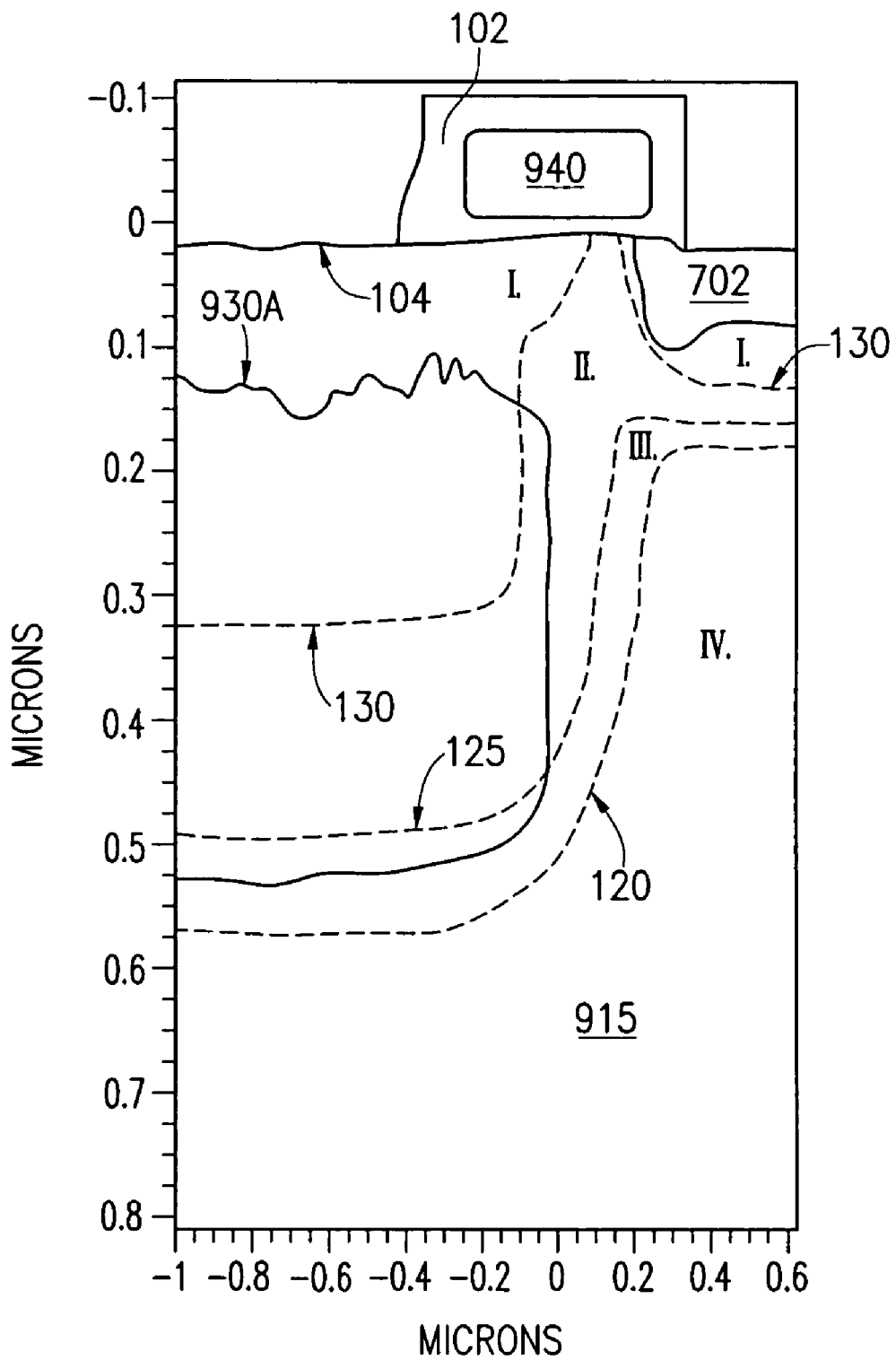
FIG. 4 illustrates an electrostatic potential contour of the diode/transfer gate region formed in a substrate and the donor concentrations in accordance with a third embodiment of the invention.

FIGS. 4-8 show doping profiles in a partially cut away side view of angled diode implants for the implanted photodiode region 930, wherein the various drawings illustrate the dopant concentrations resulting from different exemplary angled implants that may be used. FIG. 4 shows a diode region 930A that is formed in a substrate 915 as a result of the implant methods discussed above in FIG. 3A-C. Specifically, FIG. 4 illustrates a transfer gate 940, surrounded by an insulating layer 102, formed over a substrate 915, which also has an implant n-type floating diffusion region 702. Region 930A represents n-type charge collection region of the photodiode formed in accordance with the three-implant process described above in connection with FIGS. 3A-3C, wherein the implant angles of PD1-PD3 are set at $\theta_1$=5' for PD1 region 900 (see FIG. 3A), $\theta_2$=5' for PD2 region 901 (see FIG. 3B), and $\theta_3$=30° for PD3 region 902 (see FIG. 3C). FIG. 4 also shows four concentration regions (I-IV) that are formed in the substrate as a result of the three implants at the specified implant angles ($\theta_1$=5°, $\theta_2$=5°, and $\theta_3$=30°).

Region I, generally defined by the region above 130 and below regions 104 and floating diffusion 702, has the largest donor concentration between the range of just over $5E16/cm^3$ to $5E17/cm^3$. Region II, generally defined by the region between 125 and 130, has a lesser donor concentration between the ranges of just over $5E15/cm^3$ to $5E16/cm^3$. Region III, generally defined by the region between 120 and 125, has yet a smaller donor concentration between the ranges of just over $1E14/cm^3$ to $5E15 cm^3$. Region IV, generally defined by the region below 120, contains the lowest donor concentration at or below $1E14/cm^3$. As can be seen from FIG. 4, the reduce donor concentrations found in region II near the transfer gate 940 creates a potential barrier wherein the amount of donor impurities under the transfer gate 940 is reduce. This reduction lessens the occurrence of short-channel effects or punch-through beneath the gate 940.

Figure 5:
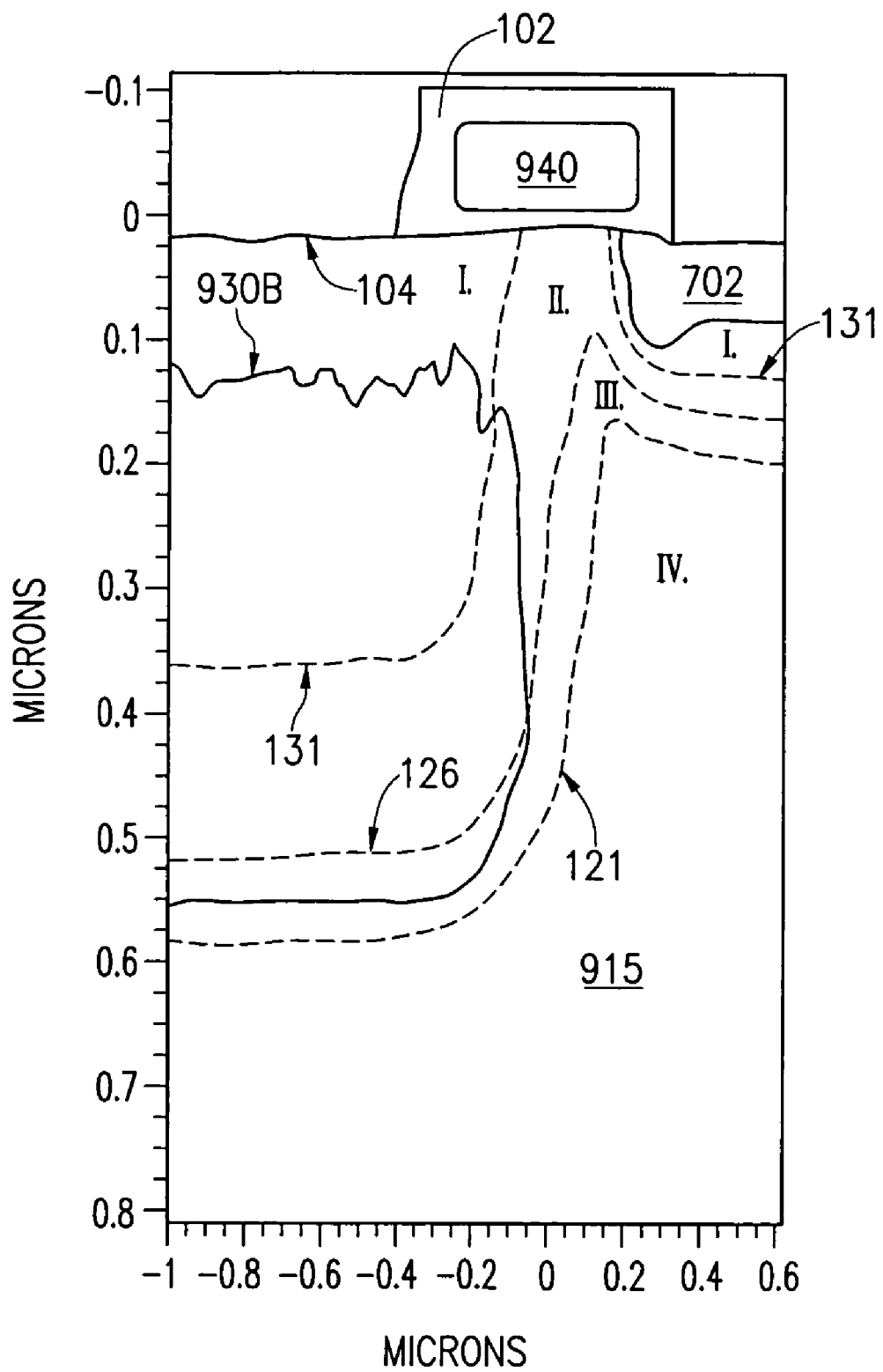
FIG. 5 illustrates an electrostatic potential contour of the diode/transfer gate region formed in a substrate and the donor concentrations in accordance with a fourth embodiment of the invention.

FIG. 5 illustrates region 930B in accordance with another embodiment of the invention. Region 930B in FIG. 5 represents the diode formed subsequent to the three-implant process described above, wherein the implant angles of PD1-PD3 are set at $\theta_1=5'$ for PD1 (see FIG. 3A), $\theta_2=5°$ for PD2 (see FIG. 3B), and $\theta_3=15°$ for PD3 (see FIG. 3C). FIG. 5 also shows four concentration regions (I-IV) that are formed in the substrate as a result of the diode region 930B formed by the three implants at the specified implant angles ($\theta_1=5°$, $\theta_2=5°$, and $\theta_3=15°$).

Region I, generally defined by the region above 131 and below regions 104 and floating diffusion 702, has the largest donor concentration between the range of just over $5E16/cm^3$ to $5E17/cm^3$. Region II, generally defined by the region between 126 and 131, has a lesser donor concentration between the ranges of just over $5E15/cm^3$ to $5E16/cm^3$. Region III, generally defined by the region between 121 and 126, has yet a smaller donor concentration between the ranges of just over $1E14/cm^3$ to $5E15/cm^3$. Region IV, generally defined by the region below 121, contains the lowest donor concentration at or below $1E14/cm^3$. As can be seen in the electrostatic potential contour illustration, the reduction of the implant angle $\theta_3$ from 30° to 15° from the previous embodiment has resulted in a wider expansion of Region II from the previous embodiment, directly beneath gate 940, resulting in a further reduction in donor impurities underneath the transfer gate 940.

Figure 6:
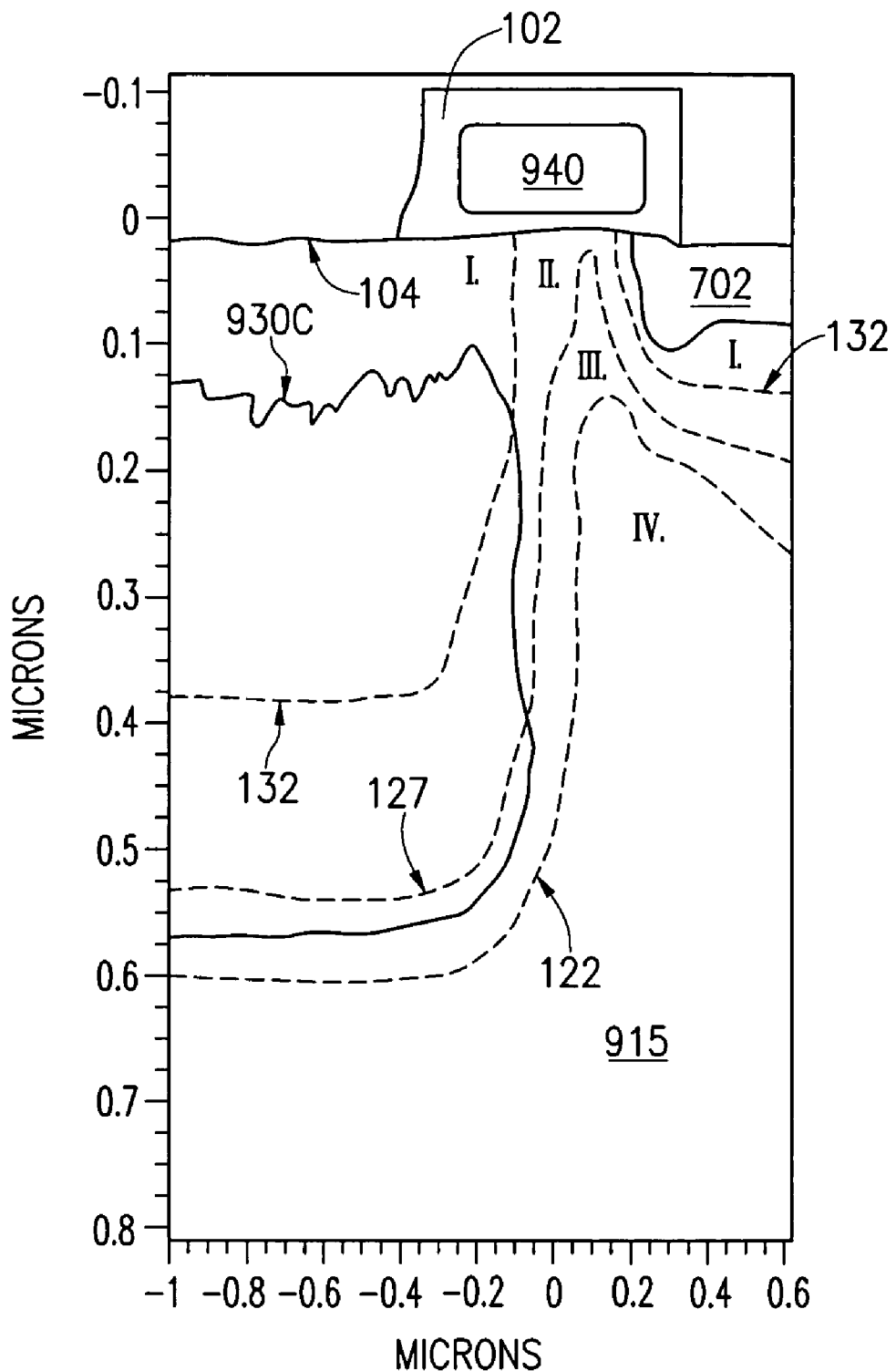
FIG. 6 illustrates an electrostatic potential contour of the diode/transfer gate region formed in a substrate and the donor concentrations in accordance with a fifth embodiment of the invention.

FIG. 6 illustrates a doping profile in accordance with a third exemplary embodiment of the invention, where a transfer gate 940 is surrounded by a insulating layer 102, formed over a substrate 915, which also having an implanted floating diffusion region 702. Region 930C in FIG. 6 represents the diode region formed subsequent to the three-implant process described above, wherein the implant angles of PD1-PD3 are set at $\theta_1=5°$ for PD1 (see FIG. 3A), $\theta_2=30°$ for PD2 (see FIG. 3B), and $\theta_3=5°$ for PD1 (see FIG. 3C). FIG. 6 also shows four concentration regions (I-IV) that are formed in the substrate as a result of the diode region 930C formed by the three implants at the specified implant angles ($\theta_1=5°$, $\theta_2=30°$, and $\theta_3=5°$).

Region I, generally defined by the region above 132 and below regions 104 and floating diffusion 702, has the largest donor concentration between the range of just over $5E16/cm^3$ to $5E17/cm^3$. Region II, generally defined by the region between 127 and 132, has a lesser donor concentration between the ranges of just over $5E15/cm^3$ to $5E16/cm^3$. Region III, generally defined by the region between 122 and 127, has yet a smaller donor concentration between the ranges of just over $1E14/cm^3$ to $5E15/cm^3$. Region IV, generally defined by the region below 122, contains the lowest donor concentration at or below $1E14/cm^3$. As can be seen in the electrostatic potential contour, the reduction of the implant angles $\theta_3$ from 15° to 5°, and the increase of implant angle $\theta_2$ from 5° to 30° from the previous embodiment has resulted in even a wider expansion of Region II from the previous embodiment, directly beneath gat 940, resulting in a further reduction in donor impurities underneath the transfer gate 940.

Figure 7:
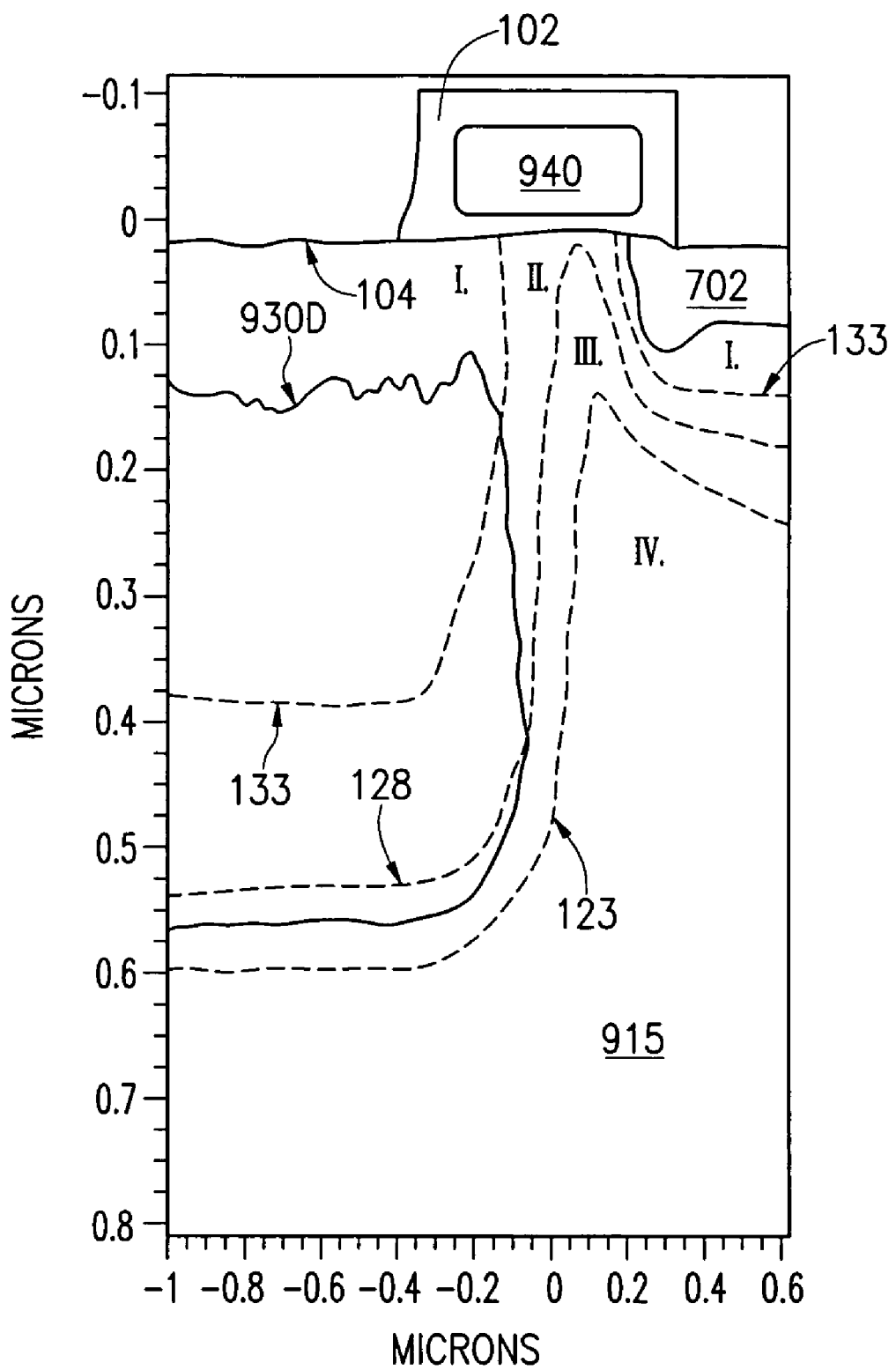
FIG. 7 illustrates an electrostatic potential contour of the diode/transfer gate region formed in a substrate and the donor concentrations in accordance with a sixth embodiment of the invention.

FIG. 7 illustrates a doping profile in accordance with a fourth exemplary embodiment of the invention. Region 930D in FIG. 7 represents the diode formed subsequent to the three-implant process described above, wherein the implant angles of PD1-PD3 are set at $\theta_1=5'$ for PD1 (see FIG. 3A), $\theta_2=15°$ for PD2 (see FIG. 3B), and $\theta_3=5°$ for PD1 (see FIG. 3C). FIG. 7 also shows four concentration regions (I-IV) that are formed in the substrate as a result of the diode region 930D formed by the three implants at the specified implant angles ($\theta_1=5°$, $\theta_2=15°$, and $\theta_3=5°$).

Region I, generally defined by the region above 133 and below regions 104 and floating diffusion 702, has the largest donor concentration between the range of just over $5E16/cm^3$ to $5E17/cm^3$. Region II, generally defined by the region between 128 and 133, has a lesser donor concentration between the ranges of just over $5E15/cm^3$ to $5E16/cm^3$. Region III, generally defined by the region between 123 and 128, has yet a smaller donor concentration between the ranges of just over $1E14/cm^3$ to $5E15/cm^3$. Region IV, generally defined by the region below 123, contains the lowest donor concentration at or below $1E14/cm^3$. The reduction of the implant angles $\theta_2$ from 30° to 15° from the previous embodiment resulted in slightly wider expansion of Region II from the previous embodiment, directly beneath gate 940, resulting in a further reduction in donor impurities underneath the transfer gate 940.

Figure 8:
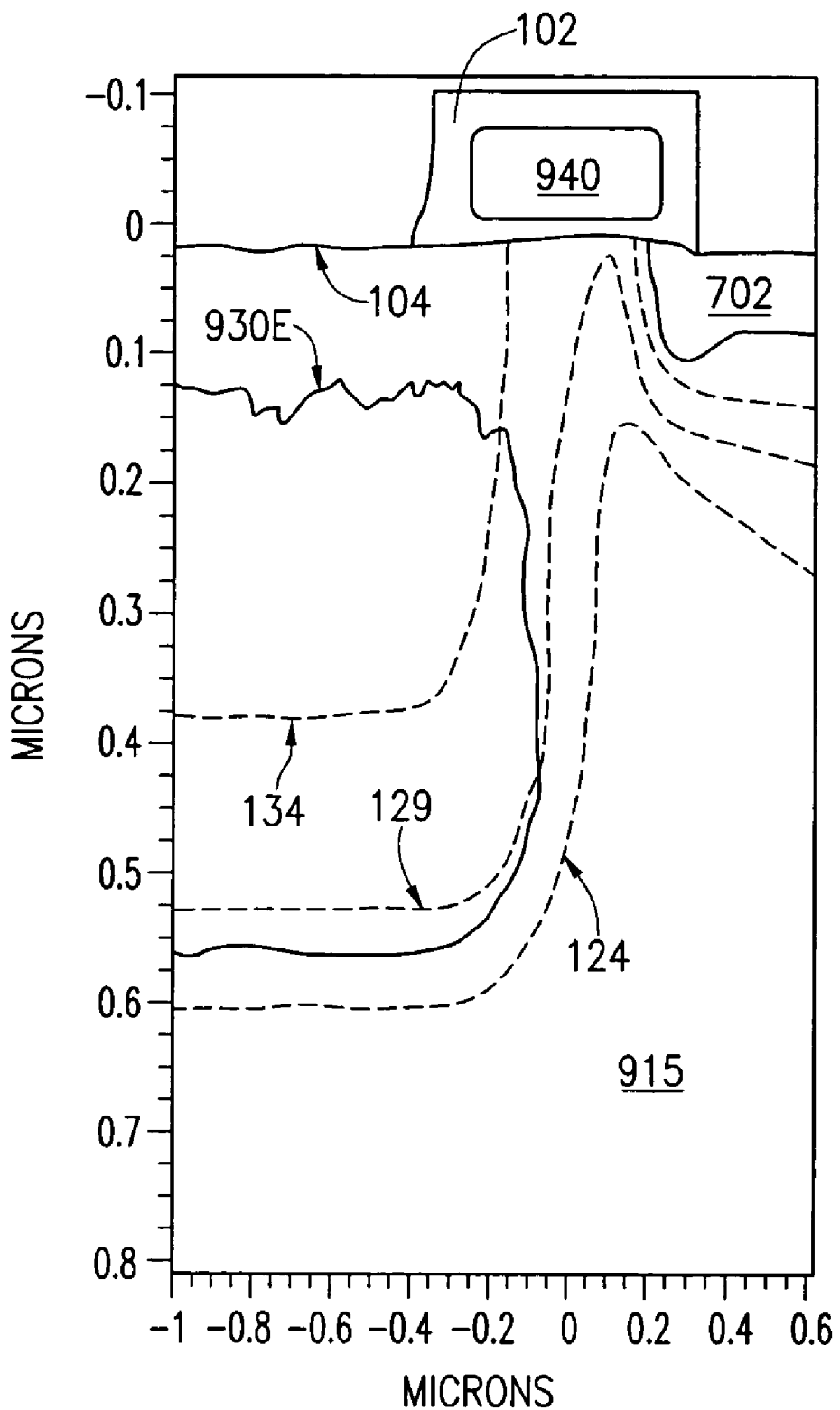
FIG. 8 illustrates an electrostatic potential contour of the diode/transfer gate region formed in a substrate and the donor concentrations in accordance with a seventh embodiment of the invention.

FIG. 8 illustrates a doping profile concentration in accordance with a fifth exemplary embodiment. Region 930E in FIG. 8 represents the diode region formed subsequent to the three-implant process described above, wherein the implant angles of PD1-PD3 are set at $\theta_1=5'$ for PD1 (see FIG. 3A), $\theta_2=5$ for PD2 (see FIG. 3B), and $\theta_3=5°$ for PD1 (see FIG. 3C). FIG. 8 also shows four concentration regions (I-IV) that are formed in the substrate as a result of the diode region 930E formed by the three implants at the specified implant angles ($\theta_1=5°$, $\theta_2=5°$, and $\theta_3=5°$).

Region I, generally defined by the region above 134 and below regions 104 and floating diffusion 702, has the largest donor concentration between the range of just over $5E16/cm^3$ to $5E17/cm^3$. Region II, generally defined by the region between 129 and 134, has a lesser donor concentration between the range of just over $5E15/cm^3$ to $5E16/cm^3$. Region III, generally defined by the region between 124 and 129, has yet a smaller donor concentration between the range of just over $1E14/cm^3$ to $5E15/cm^3$. Region IV, generally defined by the region below 124, contains the lowest donor concentration at or below $1E14/cm^3$. As can be seen in the electrostatic potential contour illustration, the reduction of the implant angles $\theta_2$ from 15° to 5° from the previous embodiment has further expanded Region II from the previous embodiment, resulting in an even greater reduction in donor impurities underneath the transfer gate 940.

Figure 9:
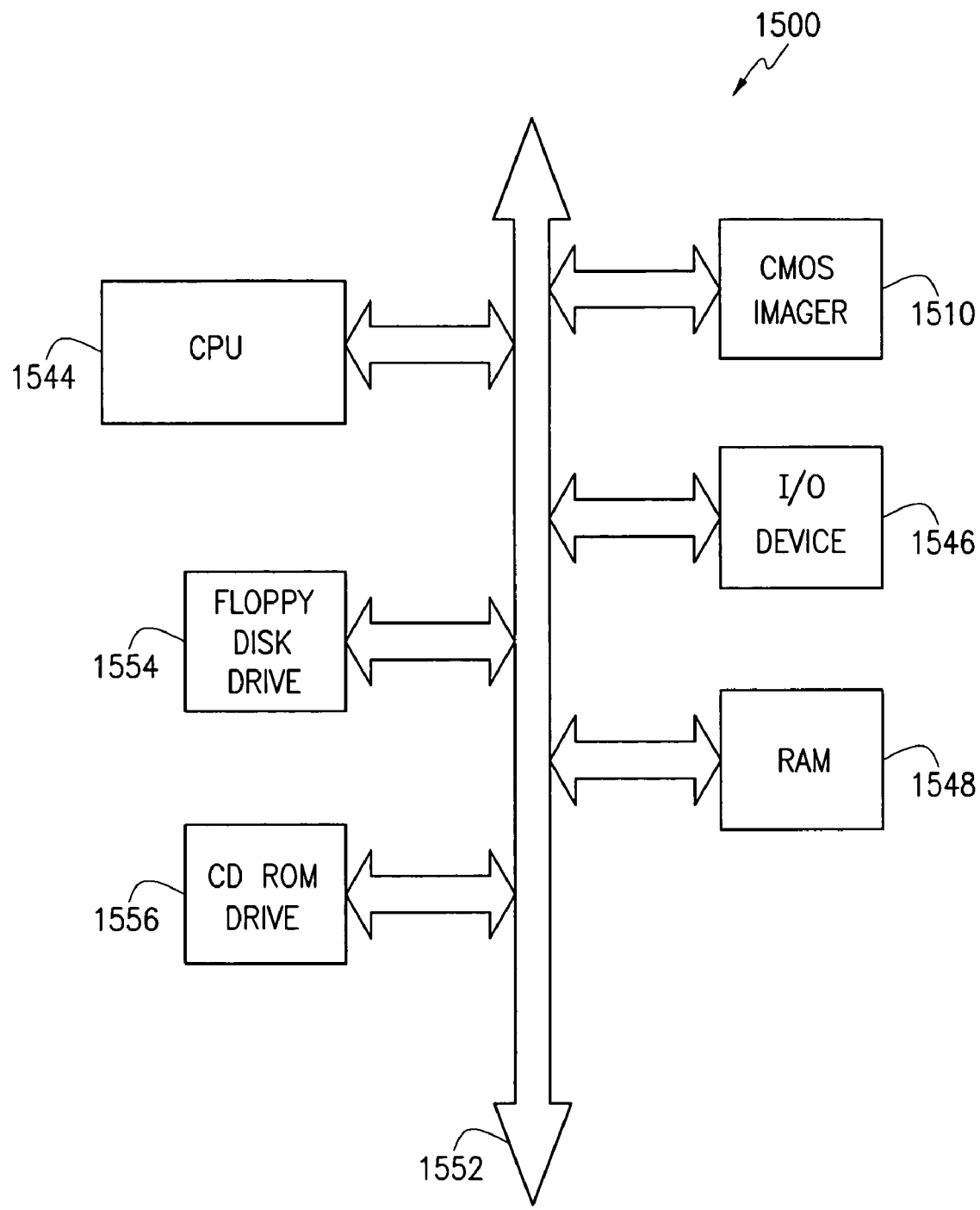
FIG. 9 is an illustration of a computer system having a CMOS imager according to the present invention.

A typical processor system which includes a CMOS imager device having pixels constructed according to the present invention is illustrated generally in FIG. 9. A pixel imager array having pixels constructed as described above may be used in an imager device having associated circuits for reading images captured by the pixel array. The imager device may, in turn, be coupled to a processor system for further image processing.

As can be seen from the process depicted in FIGS. 3A-3C and 3A-3D and in the specific examples, a portion of the implanted photo-diode region 930 which is deeper into substrate 915 extends as much or less towards the transfer gate 940, than a portion of the implanted photodiode region which does not extend as deep into the substrate. This reduces any short channel effect, as well as any associated transfer gate leakage, as compared to the photodiode implant depicted in FIG. 2.

A processor system which uses a CMOS imager having pixels fabricated in accordance with the invention, for example, generally comprises a central processing unit (CPU) 1544 that communicates with an input/output (I/O) device 1546 over a bus 1552. The CMOS imager 1510 also communicates with the system over bus 1552. The computer system 1500 also includes random access memory (RAM) 1548, and, in the case of a computer system may include peripheral devices such as a floppy disk drive 1554 and a compact disk (CD) ROM drive 1556 which also communicate with CPU 1544 over the bus 1552. As described above, CMOS imager 1510 is combined with a pipelined JPEG compression module in a single integrated circuit.

It should again be noted that although the invention has been described with specific reference to CMOS imaging circuits having a photodiode and a floating diffusion, the invention has broader applicability and may be used in forming a photodiode structure adjacent a transfer gate in any CMOS imaging apparatus. For example, the CMOS imager array can be formed on a single chip together with the logic or the logic and array may be formed on separate IC chips. In addition to transfer gates, the configuration is equally applicable to other gates, such as reset gates, global shutter, storage gate, high dynamic range gate, etc. Moreover, the implantation process described above is but one method of many that could be used. The implantation process can further be implemented on a variety of image pixel circuits, including three transistor (3T), four transistor (4T) five transistor (5T), six transistor (6T) or seven transistor (7T) structures. Accordingly, the above description and accompanying drawings are only illustrative of preferred embodiments which can achieve the features and advantages of the present invention. It is not intended that the invention be limited to the embodiments shown and described in detail herein. The invention is only limited by the scope of the following claims.

What is claimed as new and desired to be protected by Letters Patent of the United States is:

1. An image pixel structure, comprising:
    a semiconductor substrate of a first conductivity type having a surface;
    a gate over said surface of the substrate;
    a floating diffusion region within said substrate;
    a channel region under said gate; and
    a photodiode within said substrate, said photodiode including a substrate region of said first conductivity type and an implant region of a second conductivity type, said substrate region and implant region forming a junction for generating charge in response to light, said implant region including:
    a first portion extending underneath a majority of said junction, having a lower boundary in said substrates, and extending further towards a region of said substrate beneath said gate than a second portion of said implant region extends towards said region beneath said gate,
    said second portion adjacent to and substantially underneath said first portion such that said lower boundary of said first portion forms an upper boundary for at least a part of said second portion, said second portion extending underneath a majority of said junction, and
    a third portion extending further towards said region of substrate beneath said gate than said first and second portions extend toward said region beneath said gate to increase charge transfer from said implant region to said floating diffusion region when said gate is switched on and having a donor concentration of said second conductivity type less than said first and second portions to reduce short-channel effects or punch-through between said implant region and floating diffusion region when said gate is switched off.

2. The image pixel structure of claim 1, wherein the substrate is p-type, and the implants are n-type.

3. The image pixel structure of claim 1, wherein the substrate is n-type, and the implants are p-type.

4. The image pixel structure of claim 1, wherein an upper portion of said implant region is farther away from the region beneath said gate than portions of the implant region located beneath said upper portion.

5. The image pixel structure of claim 1, wherein said first portion is nearest the substrate surface in the implant region.

6. The image pixel structure of claim 1, wherein a donor concentration of the second portion is less than a donor concentration of the first portion.

7. The image pixel structure of claim 6, wherein a donor concentration of the first portion is between $5E16/cm^3$ and $5E17/cm^3$.

8. The image pixel structure of claim 1, wherein the implant region includes a fourth portion, said fourth portion being underneath the second portion in the implant region.

9. The image pixel structure of claim 8, wherein a donor concentration of the fourth portion is less than a donor concentration of the first portion.

10. The image pixel structure of claim 8, wherein the first, second, and fourth portions of the implant region are formed by implants angled between 0 and 30 degrees in the direction of the gate, said angle being measured away from a line normal to the surface of the substrate, with at least one of the implants being at an angle greater than 0 degrees.

11. The image pixel structure of claim 10, wherein the fourth portion extends further than the first and second portions towards the region of said substrate beneath said gate.

12. The image pixel structure of claim 8, wherein the implant angle for the first and second portions of the implant region is between 0-15 degrees, and the implant angle for the fourth portion is between 0-30 degrees, at least one of said implant angles being greater than 0 degrees.

13. The image pixel structure of claim 11, wherein the implant angle for the first and second portions of the implant region is between 0-10 degrees, and the implant angle for the fourth portion is between 0-15 degrees.

14. The image pixel structure of claim 8, wherein the first, second, and fourth portions of the implant region are formed by implants angled between 0 and 5 degrees in the direction of the gate, said angle being measured away from a line normal to the surface of the substrate.

15. The image pixel structure of claim 14, wherein the third portion is formed by an implant angled between 10 and 30 degrees in the direction of the gate, said angle being measured away from a line normal to the surface of the substrate.

16. The image pixel structure of claim 1, wherein at least one of said portions of said implant region is angled.

17. The image pixel structure of claim 1, wherein the image pixel structure is a CCD imager.

18. The image pixel structure of claim 1, wherein the image pixel structure is a CMOS imager.

19. The image pixel structure of claim 18, wherein said image pixel structure is one of a three transistor (3T), four transistor (4T) five transistor (5T), six transistor (6T) and seven transistor (7T) structure.

20. The image pixel structure of claim 1, wherein said gate includes a gate oxide and a conductor.

21. The image pixel structure of claim 20, wherein said conductor contains at least one of poly-silicon, silicide, metal, and any combination of poly-silicon, silicide and metal.

22. The image pixel structure of claim 20, wherein said gate includes an insulator over the conductor.

23. The image pixel structure of claim 22, wherein the insulator is formed from at least one of oxide, nitride, metal oxide, and any combination of oxide, nitride, and metal oxide.

24. A pixel imager system, comprising:
(i) a processor; and
(ii) a CMOS imaging device coupled to said processor and including:
a pixel array, at least one pixel of said array comprising:
a semiconductor substrate of a first conductivity type having a surface;
a gate over said surface of the substrate;
a floating diffusion region within said substrate;
a channel region under said gate: and
a photodiode within said substrate, said photodiode including a substrate region of said first conductivity type and an implant region of a second conductivity type, said substrate region and implant region forming a junction for generating charge in response to light, said implant region including:
a first portion extending underneath a majority of said junction, having a lower boundary in said substrate, and extending further towards a region of said substrate beneath said gate than a second portion of said implant region extends towards said region beneath said gate,
said second portion adjacent to and substantially underneath said first portion such that said lower boundary of said first portion forms an upper boundary for at least a part of said second portion, said second portion extending underneath a majority of said junction, and
a third portion extending further towards said region of substrate beneath said gate than said first and second portions extend toward said region beneath said gate to increase charge transfer from said implant region to said floating diffusion region when said gate is switched on and having a donor concentration of said second conductivity type less than said first and second portions to reduce short-channel effects or punch-through between said implant region and floating diffusion region when said gate is switched off.

25. The pixel imager system of claim 24, wherein the substrate is p-type, and the implants are n-type.

26. The pixel imager system of claim 24, wherein the substrate is n-type, and the implants are p-type.

27. The pixel imager system of claim 24, wherein an upper portion of said implant region is farther away from the region beneath said gate than portions of the implant region located beneath said upper portion.

28. The pixel imager system of claim 24, wherein said first portion is nearest the substrate surface in the implant region.

29. The pixel imager system of claim 24, wherein a donor concentration of the second portion is less than a donor concentration of the first portion.

30. The pixel imager system of claim 29, wherein a donor concentration of the first portion is between $5E16/cm^3$ and $5E17/cm^3$.

31. The pixel imager system of claim 24, wherein the implant region includes a fourth portion, said fourth portion being underneath the second portion in the implant region.

32. The pixel imager system of claim 31, wherein a donor concentration of the fourth portion is less than a donor concentration of the first portion.

33. The pixel imager system of claim 31, wherein the first, second, and fourth portions of the implant region are formed by implants angled between 0 and 30 degrees in the direction of the gate, said angle being measured away from a line normal to the surface of the substrate, with at least one of the implants being at an angle greater than 0 degrees.

34. The pixel imager system of claim 33, wherein the fourth portion extends further than the first and second portions towards the region of said substrate beneath said gate.

35. The pixel imager system of claim 31, wherein the implant angle for the first and second portions of the implant region is between 0-15 degrees, and the implant angle for the fourth portion is between 0-30 degrees, at least one of said implant angles being greater than 0 degrees.

36. The pixel imager system of claim 34, wherein the implant angle for the first and second portions of the implant region is between 0-10 degrees, and the implant angle for the fourth portion is between 0-15 degrees.

37. The pixel imager system of claim 24, where the implant dose of the third portion is between $2E11-1E13/cm^2$.

38. The pixel imager system of claim 31, wherein the first, second, and fourth portions of the implant region are formed by implants angled between 0 and 5 degrees in the direction of the gate, said angle being measured away from a line normal to the surface of the substrate.

39. The pixel imager system of claim 38, wherein the third portion is formed by an implant angled between 10 and 30 degrees in the direction of the gate, said angle being measured away from a line normal to the surface of the substrate.

40. The pixel imager system of claim 24, wherein at least one of said portion of implant regions are angled.

41. The pixel imager system of claim 24, wherein the pixel imager system is a CCD imager.

42. The pixel imager system of claim 24, wherein the pixel imager system is a CMOS imager.

43. The pixel imager system of claim 42, wherein said imager device is one of a three transistor (3T), four transistor (4T) five transistor (5T), six transistor (6T) or seven transistor (7T) architecture.

44. An imager pixel structure comprising:
a semiconductor substrate of a first conductivity type having an upper surface;
a transistor gate structure formed over the upper surface of the substrate;
a floating diffusion region within said substrate;
a channel region under said gate; and
a photosensor within said substrate, said photosensor including a substrate region of said first conductivity type and an implant region of a second conductivity type, said substrate region and implant region forming a junction for generating charge in response to light, said implant region including first, second, third, and fourth implant portions,
said first implant portion extending underneath a majority of said junction and further towards a region of said substrate beneath said gate than at least one of said second and third implant portions,
said second portion extending underneath a majority of said junction and being adjacent to and at least partially underneath said first portion,
said third portion extending underneath a majority of said junction and being adjacent to and substantially underneath said second portion, and
said fourth portion extending further towards said region of substrate beneath said gate than said first, second, and third portions extend toward said region beneath said gate to increase charge transfer from said implant region to said floating diffusion region when said gate is switched on and having a donor concentration of said second conductivity type less than said first, second, and third portions to reduce short-channel effects or punch-through between said implant region and floating diffusion region when said gate is switched off.

45. The image pixel structure of claim 44, wherein said first implant portion extends further than both said second and third regions extend toward said region in the substrate beneath said gate structure.

46. The image pixel structure of claim 44, wherein the first, second, and third portions of the implant region are formed by implants angled between 0 and 30degrees in the direction of the gate, said angle being measured away from a line normal to the surface of the substrate, with at least one of the implants being at an angle greater than 0 degrees.

47. The image pixel structure of claim 44, wherein the third portion extends further than the first and second portions towards the region of said substrate beneath said gate.

48. The image pixel structure of claim 46, wherein the implant angle for the first and second portions of the implant region is between 0-15 degrees, and the implant angle for the third portion is between 0-30 degrees, at least one of said implant angles being greater than 0 degrees.

49. The image pixel structure of claim 44, wherein:
the first implant portion is formed by implanting second conductivity type ions into said substrate at a first angle with a first energy level;
the second implant portion is formed by implanting said second conductivity type ions into said substrate at a second angle with a second energy level; and
the third implant portion is formed by implanting said second conductivity type ions into said substrate at a third angle with a third energy level,
said first, second and third angles are within the range of about 0 to about 30degrees from normal and at least one of said angles is greater than 0 degrees, and at least one of said first, second, or third energy levels is not equal to the other energy levels.

50. The image pixel structure of claim 49, wherein said first, second, and third angles are within the range of about 0 to about 5 degrees from normal.

51. The image pixel structure of claim 49, wherein said first energy level is lower than said second and third energy levels.

52. The image pixel structure of claim 51, wherein said first energy level is in the range of about 5 to about 100 KeV.

53. The image pixel structure of claim 52, wherein the second energy level is within the range of about 50 to about 250 KeV.

54. The image pixel structure of claim 53, wherein the third energy level is within the range of about 100 to about 400 KeV.

55. An image pixel structure, comprising:
a semiconductor substrate of a first conductivity type having a surface;
a gate over a surface of the substrate;
a floating diffusion region within said substrate;
a channel region under said gate: and
a photodiode within said substrate, said photodiode including a substrate region of said first conductivity type and an implant region of a second conductivity type, said substrate region and implant region forming a junction for generating charge in response to light, said implant region comprising
a first portion of said second conductivity type having a lower boundary in said substrate,
a second portion of said second conductivity type, said second portion contacting and substantially underneath said first portion such that said lower boundary of said first portion forms an upper boundary for at least a part of said second portion,
a third portion of said second conductivity type, said third portion contacting and substantially underneath said second portion such that said lower boundary of said second first portion forms an upper boundary for at least a part of said third portion, and
a fourth portion extending further towards said region of substrate beneath said gate than said first, second, and third portions extend toward said region beneath said gate to increase charge transfer from said implant region to said floating diffusion region when said gate is switched on and having a donor concentration of said second conductivity type less than said first, second, and third portions to reduce short-channel effects or punch-through between said implant region and floating diffusion region when said gate is switched off.

56. The image pixel structure of claim 55, wherein a donor concentration of said first portion is greater than a donor concentration of said second and third portions.

57. The image pixel structure of claim 55, wherein lower portions of said implant region are farther away from the region beneath said gate than portions of the implant region located above said lower portions.

58. The image pixel structure of claim 57, wherein an implant angle of said third portion, measured from orthogonal to said surface of said substrate, is at least 10 degrees less than an implant angle of said first portion.

59. The image pixel structure of claim 57, wherein a donor concentration of said first portion is greater than a donor concentration of said third portion.

60. A pixel imager system, comprising:
(i) a processor; and
(ii) a CMOS imaging device coupled to said processor and including:
a pixel array, at least one pixel of said array comprising:
a semiconductor substrate of a first conductivity type having a surface;
a gate over said surface of the substrate;and
a floating diffusion region within said substrate:
a channel region under said gate: and
a photodiode within said substrate, said photodiode including a substrate region of said first conductivity type and an implant region of a second conductivity type, said substrate region and implant region fonning a junction for generating charge in response to light, said implant region comprising
a first portion of said second conductivity type extending underneath a majority of said junction and having a lower boundary in said substrate,
a second portion of said second conductivity type extending underneath a majority of said junction, said second portion contacting and substantially underneath said first portion such that said lower boundary of said first portion forms an upper boundary for at least a part of said second portion, and
a third portion of said second conductivity type extending underneath a majority of said junction, said third portion contacting and substantially underneath said second portion such that said lower boundary of said second portion forms an upper boundary for at least a part of said third portion,
a fourth portion extending further towards said region of substrate beneath said gate than said first, second, and third portions extend toward said region beneath said gate to increase charge transfer from said implant region to said floating diffusion region when said gate is switched on and having a donor concentration of said second conductivity type less than said first, second, and third portions to reduce short-channel effects or punch-through between said implant region and floating diffusion region when said gate is switched off, wherein said first, second, and third portions have respective donor concentrations of said second conductivity type that are equal or decrease in order of said first, second, and third portions.

61. The pixel imager system of claim 60, wherein an implant angle of an upper portion of said implant region, measured from orthogonal to said surface of said substrate, is at least 10 degrees more or less than an implant angle of a lower portion of said implant region.

62. The pixel imager system of claim 60, wherein a lower portion of said implant region is farther away from the region beneath said gate than portions of the implant region located above said upper portion, and a donor concentration of said upper portion is greater than a donor concentration of said lower portion.

* * * * *

UNITED STATES PATENT AND TRADEMARK OFFICE
CERTIFICATE OF CORRECTION

PATENT NO. : 7,420,233 B2  Page 1 of 1
APPLICATION NO. : 10/689712
DATED : September 2, 2008
INVENTOR(S) : Rhodes et al.

It is certified that error appears in the above-identified patent and that said Letters Patent is hereby corrected as shown below:

In column 7, line 46, in Claim 1, delete "substrates," and insert -- substrate, --, therefor.

In column 9, line 10, in Claim 24, delete "gate:" and insert -- gate; --, therefor.

In column 11, line 7, in Claim 46, delete "30degrees" and insert -- 30 degrees --, therefor.

In column 11, line 30, in Claim 49, delete "30degrees" and insert -- 30 degrees --, therefor.

In column 11, line 52, in Claim 55, delete "gate:" and insert -- gate; --, therefor.

In column 11, line 58, in Claim 55, after "compirising" insert -- : --.

In column 12, line 36, in Claim 60, after "substrate;" delete "and".

In column 12, line 37, in Claim 60, delete "substrate:" and insert -- substrate; --, therefor.

In column 12, line 38, in Claim 60, delete "gate:" and insert -- gate; --, therefor.

In column 12, line 42, in Claim 60, delete "fonning" and insert -- forming --, therefor.

Signed and Sealed this

Eleventh Day of November, 2008

JON W. DUDAS
*Director of the United States Patent and Trademark Office*